US010824312B2

United States Patent
Stubler et al.

(10) Patent No.: US 10,824,312 B2
(45) Date of Patent: Nov. 3, 2020

(54) METHOD AND SYSTEM FOR ASSISTING INSTALLATION OF ELEMENTS IN A CONSTRUCTION WORK

(71) Applicant: VINCI CONSTRUCTION, Rueil Malmaison (FR)

(72) Inventors: Jerome Stubler, Paris (FR); Cedric Sauviat, Saint Germain en Laye (FR)

(73) Assignee: VINCI CONSTRUCTION, Rueil Malmaison (FR)

( * ) Notice: Subject to any disclaimer, the term of this patent is extended or adjusted under 35 U.S.C. 154(b) by 17 days.

(21) Appl. No.: 15/777,555

(22) PCT Filed: Dec. 1, 2015

(86) PCT No.: PCT/IB2015/002653
§ 371 (c)(1),
(2) Date: May 18, 2018

(87) PCT Pub. No.: WO2017/093779
PCT Pub. Date: Jun. 8, 2017

(65) Prior Publication Data
US 2019/0235733 A1   Aug. 1, 2019

(51) Int. Cl.
*G06F 3/0484* (2013.01)
*G06Q 50/08* (2012.01)
*G06Q 10/00* (2012.01)
(Continued)

(52) U.S. Cl.
CPC ......... *G06F 3/04845* (2013.01); *G01C 15/02* (2013.01); *G06F 3/03542* (2013.01);
(Continued)

(58) Field of Classification Search
None
See application file for complete search history.

(56) References Cited

U.S. PATENT DOCUMENTS

2008/0055554 A1* 3/2008 Tubin ................... G03B 21/26
353/30
2010/0123892 A1   5/2010 Miller et al.
(Continued)

FOREIGN PATENT DOCUMENTS

WO   2005025199 A2   3/2005
WO   2008002918 A2   1/2008
(Continued)

OTHER PUBLICATIONS

Song, Hyunyoung, et al. "PenLight: combining a mobile projector and a digital pen for dynamic visual overlay." Proceedings of the SIGCHI Conference on Human Factors in Computing Systems. ACM, 2009. (Year: 2009).*

*Primary Examiner* — Ryan M Gray
(74) *Attorney, Agent, or Firm* — Dentons US LLP

(57) ABSTRACT

The method involves projecting layout information on a working surface of a construction work. The projected layout information is obtained from a model, such as a Building Information Model (BIM), of a portion at least of the construction work. It includes first graphical information depicting a reference feature visible on the working surface, and second graphical information designating locations for installation of construction elements. The locations are linked, in the model, to the reference feature depicted by the first graphical information. In response to a user action of selecting the first graphical information and a geometric transformation, the projected first graphical information and second graphical information are shifted together in accordance with the selected transformation.

31 Claims, 7 Drawing Sheets

(51) Int. Cl.
  *G01C 15/02* (2006.01)
  *G06F 30/13* (2020.01)
  *G06F 3/0354* (2013.01)
(52) U.S. Cl.
  CPC .......... *G06F 3/04842* (2013.01); *G06F 30/13* (2020.01); *G06Q 10/00* (2013.01); *G06Q 50/08* (2013.01)

(56) References Cited

U.S. PATENT DOCUMENTS

| | | | | |
|---|---|---|---|---|
| 2011/0169924 A1* | 7/2011 | Haisty | .................. | H04N 9/3147 348/51 |
| 2012/0029870 A1* | 2/2012 | Stathis | ................. | G01C 15/002 702/155 |
| 2012/0242830 A1* | 9/2012 | Kumagai | ................. | G01C 15/004 348/135 |
| 2013/0019486 A1* | 1/2013 | Hayes | .................. | G01C 15/004 33/228 |
| 2013/0074350 A1* | 3/2013 | Le Mer | .................... | B63B 9/00 33/228 |
| 2013/0137079 A1 | 5/2013 | Kahle et al. | | |
| 2013/0293705 A1* | 11/2013 | Schorr | ................. | G01C 15/002 348/135 |
| 2013/0326892 A1* | 12/2013 | Schorr | ................. | G01C 15/004 33/228 |
| 2014/0160115 A1 | 6/2014 | Keitler et al. | | |
| 2015/0089453 A1 | 3/2015 | Dal Mutto et al. | | |
| 2015/0160000 A1* | 6/2015 | Hayes | ................. | G01C 15/002 702/155 |
| 2016/0057400 A1* | 2/2016 | Winter | ................. | G01C 15/004 348/745 |
| 2016/0292918 A1* | 10/2016 | Cummings | .......... | H04N 5/2252 |

FOREIGN PATENT DOCUMENTS

| | | |
|---|---|---|
| WO | 2011121256 A1 | 10/2011 |
| WO | 2013082197 A2 | 6/2013 |
| WO | 2014159768 A1 | 10/2014 |

* cited by examiner

METHOD AND SYSTEM FOR ASSISTING INSTALLATION OF ELEMENTS IN A CONSTRUCTION WORK

This application is a National Phase Entry of International Application No. PCT/IB2015/002653, filed Dec. 1, 2015, which is hereby incorporated by reference in its entirety for all purposes as if fully set forth herein.

The present invention relates to techniques for displaying information derived from a model of a structure on working surfaces to assist workers in the installation of construction elements.

BACKGROUND

Building Information Modelling is more and more widely used in the construction industry and particularly for large and complex building constructions. The Building Information Model (BIM) is a digital representation of a structure, which aims at providing a comprehensive description of all the construction elements arranged in the structure. The representation includes files used by the designers of the structure to define or represent the locations, shapes, and other structural and/or functional characteristics of the construction elements. They are also used by contractors and their workers to build or renovate the structure. They can also be maintained afterwards, to be used over the life of the building.

While the present invention is applicable when any kind of computer model providing 2D and/or 3D representations of a construction work is available, the models referred to as BIM are the most typical example and will be more particularly developed in the following.

The description in the BIM is in three dimensions (3D) or more. However, it is quite common to print or display 2D drawings generated from the BIM for the benefit of site engineers and workers involved in setting out the construction elements.

There is a need for the building contractors to devise new methods for carrying out works on site which are based on a more straightforward and efficient use of the BIM.

It has been proposed to process information from a BIM to generate a graphical representation of the layout of elements to be installed on a surface of the construction work, e.g. a wall, floor or ceiling, in order to display the graphical representation directly on the surface by means of a projector. Similar methods have been used in various industries, such as in factories (e.g. WO 2005/025199 A2), shipyards (e.g. WO 2011/121256 A1), etc.

In the construction industry, the working surfaces on which the graphical representation is displayed are typically floors, ceilings and walls belonging to the primary frame or the non-structural partitions of the building.

The construction information graphically displayed may consist of images of fixtures (piping, cables, other electrical, plumbing or HVAC components, kitchen or bathroom equipment, etc.) to be installed on the working surface, or of lines showing an outline of such fixtures. Typically, with or without such images or outlines, it includes points and/or lines indicating locations of fixings and fittings for the fixtures, of inlets and outlets, etc.

These visual indicia are helpful for the operators when installing the fixtures. They can simply use their tools, e.g. power drills, cutters, saws, nail guns, ramset guns, etc., at the locations indicated by the graphics displayed on the working surface itself.

An example of such a system for projecting layout information on a surface in a building under construction is disclosed in WO 2014/159768 A1. That system includes a projector mounted on a scissor lift supporting an operator. The projector projects an image on a ceiling above the lift to indicate the location of connectors, anchors, and holes to be affixed to, or cut through, the surface. A system accurately determines the two dimensional position of the projector in the building, and a distance measuring system determines the distance from the projector to the ceiling. A processor coupled to a memory having a stored BIM provides an image signal to the projector adjusted for the two dimensional location of the projector and for the distance from the projector to the surface.

The projected information ensures, theoretically, that the elements are installed at the right places. It also increases productivity because the workers do not have to spend time dropping their tools to check 2D plans, grab measurements instruments such as ruler, square, spirit level, etc., and mark the places where the tools should be used.

Those advantages of prior art proposals are obtained on condition that the spatial alignment of the projected information and the substrate on which it is projected is exact. While this may be reasonably achieved in an industrial environment such a factory where, in most cases, manufacturing conditions are accurately controlled using robots or positioning elements forming part of the production line, the assumption does not hold so well on a construction site, for a number of practical reasons.

A first reason is that the projection equipment must be repeatedly moved on site, to face different working surfaces one after the other, from room to room or from wall to wall within the same room. The operator may painstakingly position the projection equipment each time to ensure good alignment, but the time that it takes affects productivity. If he or she works under time pressure, which is rather common, he or she may trade for a coarser positioning, and projecting the graphic information on the substrate to ensure precise conformity with the BIM becomes pointless. Therefore, known systems require a very accurate positioning system in order to determine the exact location of the projector within the building and its exact situation respective to the elements of works already constructed (e.g. floors and walls). However, those elements may not be located exactly at the intended coordinates because of construction tolerances and structural deflections. Also, an automatic positioning system providing very accurate positioning may be expensive and it may be unusable in a number of cases. For example, indoor GPS positioning may not work.

A second reason is that, in practice, the actual structure being built does not always match perfectly to the one described in the reference frame of the BIM. This can be due to errors made when erecting the structure. An erroneous placement or dimensioning of an element is sometimes accepted by the site engineer if it does not lead to too severe consequences and if keeping it makes more sense than destroying and building again. The mismatch may also be due to decisions made by the workers or site engineers to deal with situations not foreseen by the designers and reflected in the BIM.

When the alignment of the projected information and the substrate is not exact, using the projected information to set out new elements can lead to more errors or inconsistencies in the construction. This can lead to a final structure that is not satisfactory for users and potentially non-compliant with certain construction rules.

An object of the present invention is to provide a method for assisting the installation of construction elements based on projected layout information derived from a model, such as a BIM for example, that is more adapted to practical requirements than prior art proposals.

SUMMARY

A method of assisting installation of construction elements in a construction work is disclosed. The method comprises:

projecting layout information on a working surface of the construction work, wherein the projected layout information is obtained from a model, e.g. a BIM, of a portion at least of the construction work and includes first graphical information depicting a reference feature visible on the working surface, and second graphical information designating at least one location for installation of a construction element, the location being linked, in the model, to the reference feature depicted by the first graphical information; and in response to a user action of selecting the first graphical information and a geometric transformation, changing the projected first and second graphical information together in accordance with the selected transformation.

The method does not require very accurate positioning of the projection equipment with respect to the construction site and the reference frame of the model. However, it delivers accurate setting-out information, thanks to the involvement of the operator on site and to the structure of the data in the model. The operator can cause shifting of the graphical information depicting reference features visible on the working surface to align it with the actual position of the reference features (e.g. edge, ceiling, floor . . . ). Each reference feature can be shifted independently of the others and together with its own subset(s) of locations for installation of construction elements. This allows accurate positioning of the construction elements with respect to the associated reference features as defined in the model.

According to a convenient mode of interaction with the operator, selecting the first graphical information comprises detecting activation of a handheld beacon, determining spatial coordinates of the activated beacon, and selecting the first graphical information if the determined spatial coordinates match a projection position of the first graphical information. When the geometric transformation is selected as a translation along the working surface, selecting the translation may comprise tracking the beacon in an activated state, determining spatial coordinates of the beacon being tracked, detecting deactivation of the beacon, and determining the selected translation based on the spatial coordinates of the beacon upon activation and the spatial coordinates of the beacon upon deactivation.

The handheld beacon can be incorporated in a stylus-shaped tool that the operator manipulates to select features graphically displayed on the working surface and drag them to the appropriate positions. The spatial coordinates of the beacon are typically determined using a robotic total station associated with the projection equipment.

In an embodiment, the method includes a setup phase comprising placing projection equipment in front of the working surface, detecting a plurality of activations of a handheld beacon, determining spatial coordinates of the beacon upon each detected activation, acquiring parameters of a spatial relationship between the projection equipment and the working surface as a function of the determined spatial coordinates, and determining data for projecting the layout information on the working surface from the projection equipment based on the model and the acquired parameters of the spatial relationship. The setup phase may further comprise projecting symbols on the working surface to prompt a user to successively activate the beacon at locations of the projected symbols.

The projection equipment may be associated with a positioning system to evaluate position and orientation thereof with respect to the model. The positioning system may comprise a rangefinder to provide distance information between the working surface and the projection equipment, the distance information being processed to automatically adjust a scale of the projected layout information. The positioning system may also comprise a camera, the method further comprising analyzing an output signal of the camera to assist in positioning and scaling of the projected layout information.

In an embodiment, a plurality of reference features visible on the working surface are defined in the model, and the projected layout information includes first graphical information depicting each of the plurality of reference features visible on the working surface. The first graphical information depicting one of the plurality of reference features is independently changeable in response to a user action of selecting the first graphical information and a respective geometric transformation.

In an embodiment, the model includes positional tolerance attributes for at least some of the construction elements. The method may then comprise processing the positional tolerance attribute for a construction element so as to indicate, on the working surface, a range around the designated location for installation of said construction element.

It is appropriate to provide the model with a data structure defining construction element subsets respectively associated with a plurality of reference features. For each subset associated with a reference feature, the data structure includes a respective position attribute indicating a relative position of the subset with respect to the reference feature.

The data structure of the model may further include inter-subset arrangement rules defining acceptable positions of a construction element subset relatively to other subsets. Such an embodiment of the method further comprises projecting a visual indication of inter-subset arrangement rules on the working surface in connection with each construction element subset associated with a reference feature visible on the working surface.

Another type of user action can be provided for selecting the second graphical information designating a location for installation of a construction element on the working surface and a displacement along the working surface. In response to such action, the selected second graphical information projected on the working surface may be shifted in accordance with the selected displacement, independently of the first graphical information depicting the reference feature to which the designated location is linked in the model.

Thus, the operator has a possibility to change the spatial relationship of the projected second graphical information with respect to the associated first graphical information, if such a change appears to be appropriate. This can be done with certain conditions. For example, shifting the second graphical information independently of the first graphical information may be performed on condition that the selected displacement is within any positional tolerance attributes defined in the model for the subset. Alternatively or additionally, shifting the second graphical information independently of the first graphical information may be performed on condition that the selected displacement complies with inter-subset arrangement rules provided in the model to define acceptable positions of construction element subsets relatively to other subsets.

Following shifting of the second graphical information independently of the first graphical information, the method may comprise updating the position attribute for the construction element subset in the data structure of the model based on the selected displacement.

In addition, following a change of the projected first and second graphical information in response to a user action of selecting the first graphical information and a geometric transformation, the method may comprise modifying an as-built version of the model to reflect the change.

The model of a portion at least of the construction work is typically a Building Information Model (BIM), though other kinds of models may also be considered.

An embodiment of the method further comprises projecting a scale indication along at least one dimension of the working surface.

Another aspect of the present invention relates to a system for assisting installation of construction elements in a construction work. The system comprises:

projection equipment for projecting layout information on a working surface of the construction work;

a processor having access to a model of a portion at least of the construction work, for controlling the projection equipment such that the projected layout information includes first graphical information depicting a reference feature visible on the working surface, and second graphical information designating at least one location for installation of a construction element, the location being linked, in the model, to the reference feature depicted by the first graphical information; and a user interface for detecting a user action of selecting the first graphical information and a geometric transformation, wherein the processor is configured to control the projection equipment, in response to the detected user action, by changing the projected first and second graphical information together in accordance with the selected transformation.

Typically, the user interface comprises a handheld beacon and a total station for determining spatial coordinates of the beacon.

Another aspect of the present invention relates to a computer program for assisting installation of construction elements in a construction work. The program comprises instructions to be executed in a processor associated with projection equipment, a user interface and an interface with a model of a portion at least of the construction work. Execution of the instructions controls performance of the steps of a method as outlined above.

Yet another aspect of the present invention relates to a method of structuring information in a model of a portion at least of a construction work. The method comprises:

for each of a plurality of reference features visible on at least one working surface of the construction work, storing first data in the model defining a 3D position of said reference feature;

for each of a plurality of construction elements to be installed on the working surface, storing second data in the model describing at least one location for installation of said construction element; and defining, in the model, construction element subsets respectively associated with the reference features, wherein for each subset associated with a reference feature, the second data include a respective position attribute indicating a relative position of said subset with respect to said reference feature.

For at least some of the construction elements, the second data may further include a positional tolerance attribute parallel to the working surface.

Representations of inter-subset arrangement rules defining acceptable positions of a construction element subset relatively to other subsets may also be stored in the model.

Other features and advantages of the method and apparatus disclosed herein will become apparent from the following description of non-limiting embodiments, with reference to the appended drawings.

DESCRIPTION OF EMBODIMENTS

Figure 1:
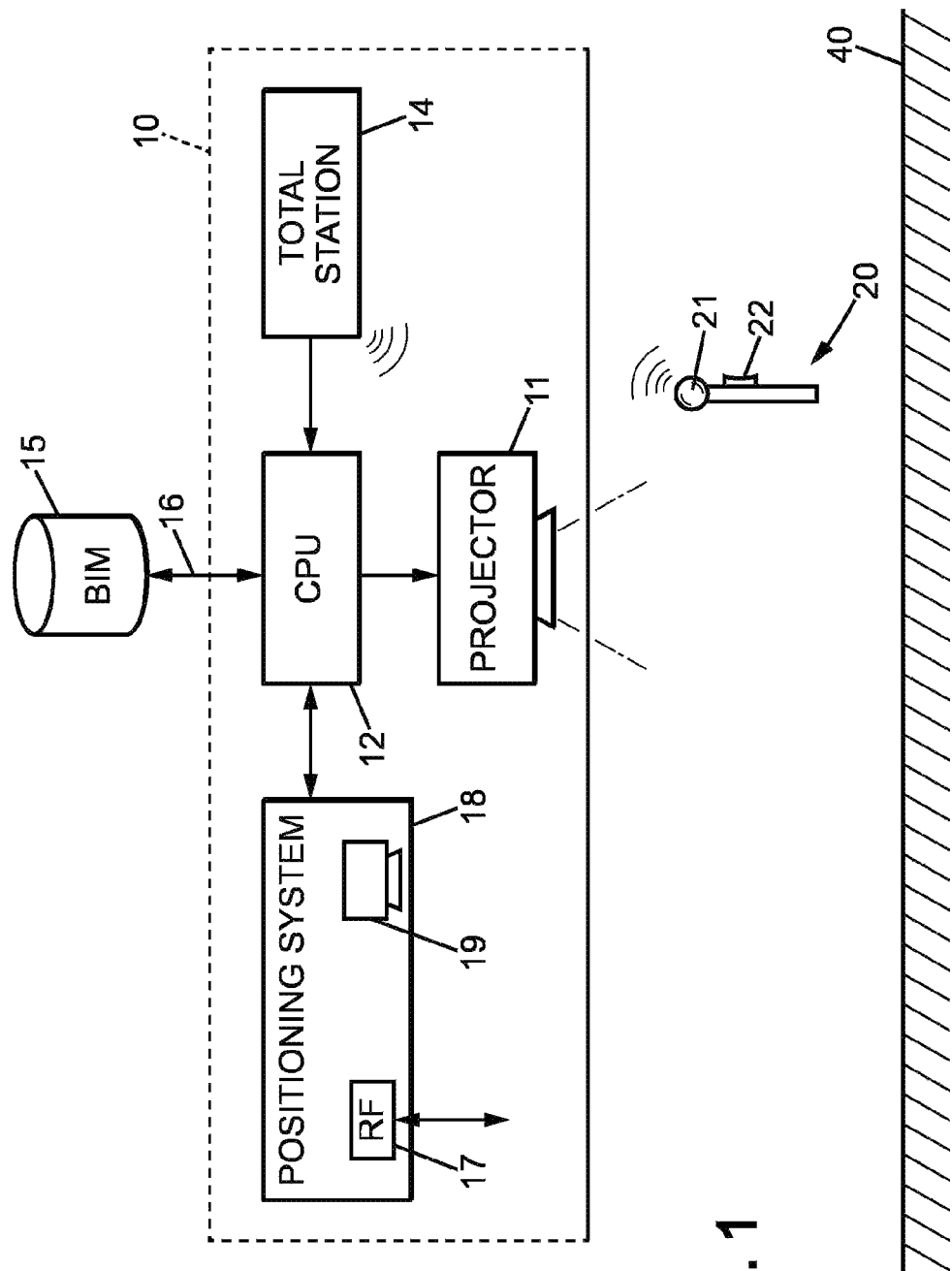
FIG. 1 is a block diagram of a system in accordance with an embodiment of the invention.

A system for assisting installation of construction elements in a construction work is shown in FIG. 1. The system includes an apparatus 10 to be placed in each room or space where the method according to the invention is to be used.

The apparatus 10 comprises projection equipment 11 which, in use, is placed in front of a working surface 40 of the construction work and a processor, or central processing unit (CPU) 12. The projection equipment may include one projector 11 as shown, or a plurality of projectors jointly controlled by the processor 12. The processor 12 provides control signals to the projector 11 for displaying layout information on the working surface. Alternatively, the projection equipment 11 may include one or more laser source controlled by the processor 12 to display dots or lines on the working surface.

In the following, it is assumed, without limitation, that the working surface is a planar surface. The assumption is valid is the vast majority of practical cases. However, the present invention is applicable to working surfaces having all sorts of shapes.

The processor 12 may be of a kind conventionally used in personal computers (PCs). If the apparatus 10 incorporates a PC, the processor 12 may be its CPU. Otherwise, it may be a dedicated processor provided in the apparatus 10. The processor 12 is coupled with a computer readable medium on which one or more computer programs are recorded. The computer program has suitable instructions for controlling execution of a method as described below when it is run by the processor cooperating with the projector 11 and a user interface.

In the example shown, the user interface includes a total station 14 forming part of the apparatus 10 and a handheld tool 20. The total station 14 operates in a known manner by interacting with a reflective beacon 21 forming part of the handheld tool 20. The beacon 21 is activated by the operator by means of a thumb-actuated button 22, for example, provided in the handheld tool 20. A wireless connection, e.g. infrared or radio, makes it possible for the total station 14 to detect activation of the beacon when the operator presses the button 22 and deactivation when the operator releases the button 22. In a conventional manner, the total station 14 has a distance meter for detecting the distance to the beacon 21 and a theodolite for detecting the viewing angles of the beacon. From the detected distance and angles, the total station 14 derives the 3D spatial coordinates of the beacon 21.

While the beacon 21 remains activated, the total station 14 tracks the beacon 21 by determining its spatial coordinates. The coordinates are determined in a reference frame fixed with respect to the total station 14. They are supplied to the processor 12 via a wired or wireless link between the total station 14 and the processor 12. From those coordinates and the known spatial relationship between the projector 11 and the total station 14 in the apparatus 10, the processor 12 determines the 3D coordinates of the handheld beacon 21 in a reference frame of the projector.

Therefore, the tool 20 can be used by the operator in the field of view of the projector 11 and the total station 14 to have actions similar to those of a computer mouse:

select an item displayed by the projector 11 by activating the beacon 21 in or near the trajectory of a light beam emitted by the projector 11 controlled by the processor 12 to display the item;

drag-and-drop an item by selecting a displacement along the working surface. The item is first selected as mentioned above by activating the beacon at a first position in the field of view of the projector. Then the displacement is selected upon deactivation of the beacon at a second position. The displacement may be obtained as a translation along the working surface, with a translation vector equal to the projection, on the working surface, of the 3D vector between the first and second positions. If the first and second positions are both on the working surface (e.g. where the operator is expected to slide the beacon 21 in contact with the working surface), no projection is necessary to determine the translation vector.

The processor 12 is coupled to a memory 15 via an interface 16. The memory 15 may be part of a computer, e.g. PC-type, incorporating the processor 12. It may also be an external memory such as a hard drive or a flash memory connected to the processor 12 via a USB port or the like. Advantageously, the memory 15 is in a remote server to which the processor has access via an interface 16 of the wireless type.

A model of the construction work is stored in the memory 15. Typically, the model is in the form of a BIM. By accessing to it, the processor 12 can generate 2D views or schematics of working surfaces belonging to the construction, using known BIM software, and control the projector 11 to show information on the working surface itself.

Figure 2:
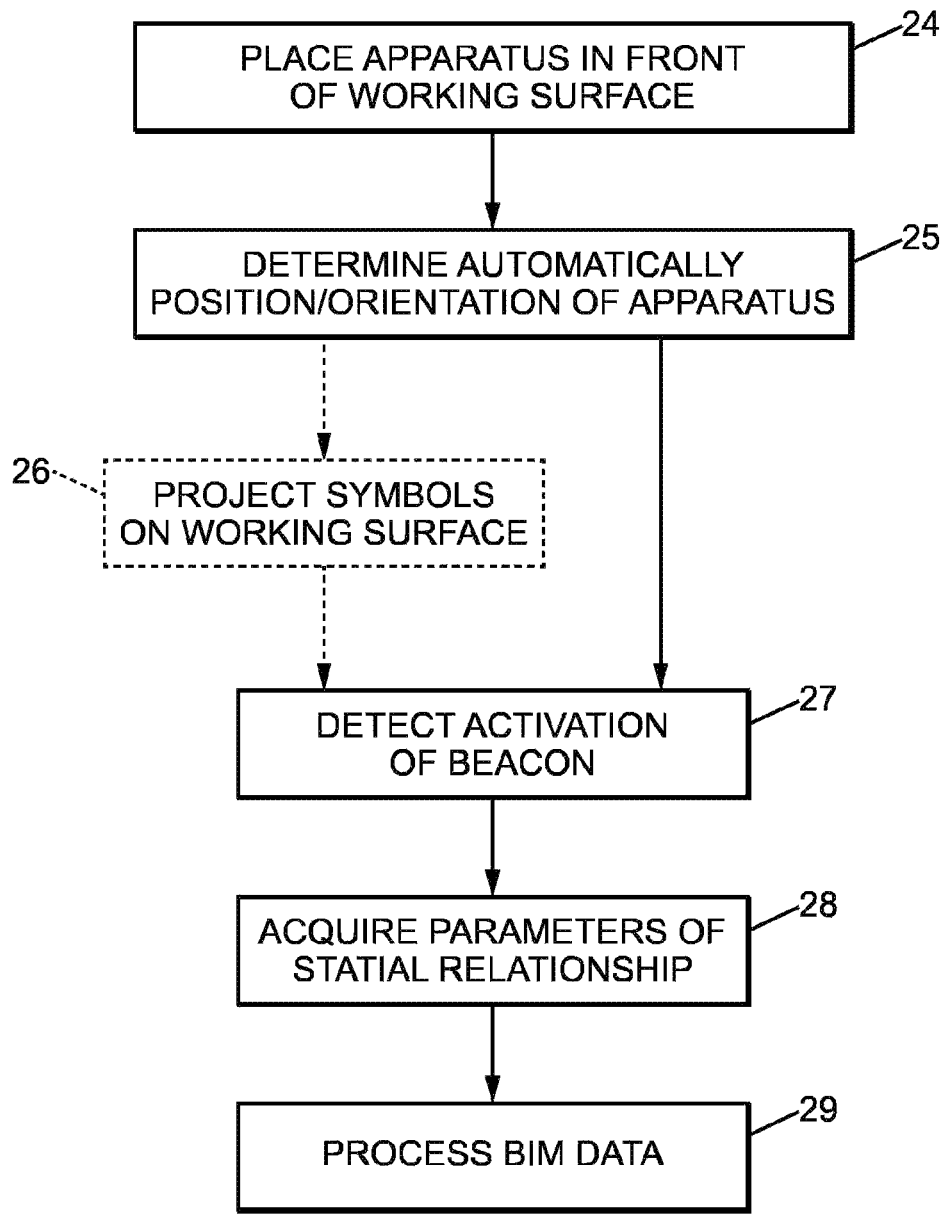
FIG. 2 is flow chart illustrating a setup phase forming part of embodiments of the invention.

To do so, the processor 12 needs to acquire the position of the working surface with respect to the apparatus 10 including the projector 11. This is performed by cooperating with the total station 14 in a setup phase which may be executed as shown in FIG. 2.

At first (step 24), the operator puts the apparatus 10 including the projection equipment 11 in front of the working surface where he or she intends to set out construction elements, at a distance of a few meters, typically. In an optional step 25, an automatic determination of the position and orientation of the apparatus 10 relative to a reference frame of the BIM is performed.

For this, the processor 12 may be coupled to a positioning system 18 (FIG. 1) that includes a GPS receiver for providing an estimation of the 3D coordinates of the projector 11 and a compass for providing an estimation of the orientation of the optical axis of the projector 11 relative to the reference frame of the BIM. The positioning system 18 may also include a rangefinder 17 and/or gyro sensors and/or acceleration sensors. Positioning with such means is not sufficiently accurate in the context of providing a precise visual assistance to the setting out of construction elements. However, it is usually enough for the processor 12 to be able to determine in which room the apparatus 10 is located and which surface of the room it is facing. From that determination, it can call from the memory 15 the BIM data needed to display the information pertaining to the relevant working surface. The distance information between the working surface 40 and the projector 11, provided by the rangefinder 17, can be used by the processor 12 to automatically adjust the scale of the projected layout information.

The positioning system 18 may further include a camera 19 whose signal can be analyzed by pattern recognition or scanning software run by the processor 12, or a dedicated processor associated with the camera 19, to locate automatically key elements of the working surface. Such key element can correspond to textures or salient features of the working surface. It can also be encoded information carried by the working surface, e.g. a printed QR code. Detection of such encoded information via the camera 19 identifies which working surface is in front of the projection equipment 11 and can be used to determine the spatial relationship of the apparatus 10 with respect to the working surface 40 in order to obtain parameters for projecting the information at the right scale and with a reasonably good alignment.

The exemplary setup phase illustrated by FIG. 2 includes detection of a plurality of activations of the handheld beacon 21 (step 27). For example, the operator can activate the beacon 21 three times while placing it on the working surface to have its spatial coordinates determined by the total station 14 at three non-aligned points of the working surface. From the spatial coordinates of those points provided by the total station 14, the processor acquires parameters of the spatial relationship between the projector 11 and the working surface at step 28. Using those parameters, the processor 12 processes the BIM data regarding the working surface at step 29, so as to apply the relevant spatial transformation to the image signal to display the layout information on the working surface via the projector 11.

The activation of the beacon 21 at step 27 can be at any points of the working surface chosen by the operator. Alternatively, the operator can be prompted to activate the beacon 21 at the specific location of one or more symbols projected on the working surface from the projector 11 controlled by the processor 12 (step 26). This can improve the accuracy in the determination of the parameters of the spatial relationship between the projector 11 and the working surface while reducing the number of points to be selected by the operator.

More generally, the projector 11 and the handheld tool 20 associated with the total station 14 provide a graphical user interface which can be used to implement various features of a man-machine interface by software run by the processor 12. By way of example, if the processor has not determined by itself the working surface of the construction on which the projector 11 displays information, the man-machine interface can be used for determining it through interaction with the operator. One way of doing it is to cause the projector 11 to display schematics of the building on the working surface so that the operator can manipulate the handheld tool 20 to designate the floor in the building, then the room in the floor and then the working surface in the room.

The processor 12 may also control the projector 11 to display a scale along one and preferably both dimensions of the working surface to assist the operator in the setting out steps. It is possible for the operator to check the scale(s) as displayed on the working surface and enter zoom-in or zoom-out commands, preferably using the handheld tool 20 in order to select the appropriate scale for projecting the layout information.

Once the setup phase shown in FIG. 2 is completed, there are still reasons to have misalignment of the layout information displayed on the working surface by means of the projector 11. The layout information may be offset along a direction parallel to the working surface. In theory, misalignment by rotation in the plane of the working surface could occur too. But in practice, the vertical direction can be considered to be established with good reliability in a construction site, so that rotations can be ignored. Offsets can be due to lack of precision of the position and orientation obtained by the positioning system 18 or, if the system 18 is absent or does not work properly, to the fact that the operator did not place the apparatus 10 at a central position with respect to the working surface.

Figure 3:
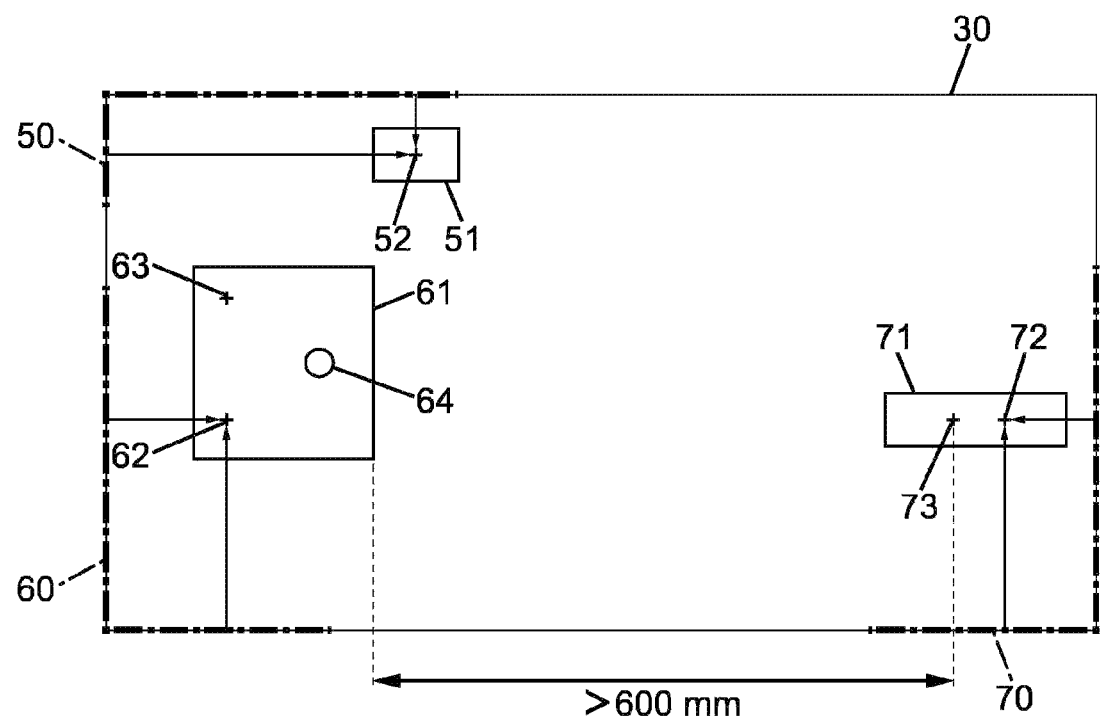
FIG. 3 is a diagram illustrating a data structure of a BIM with respect to a working surface of a construction work.
Figure 4:
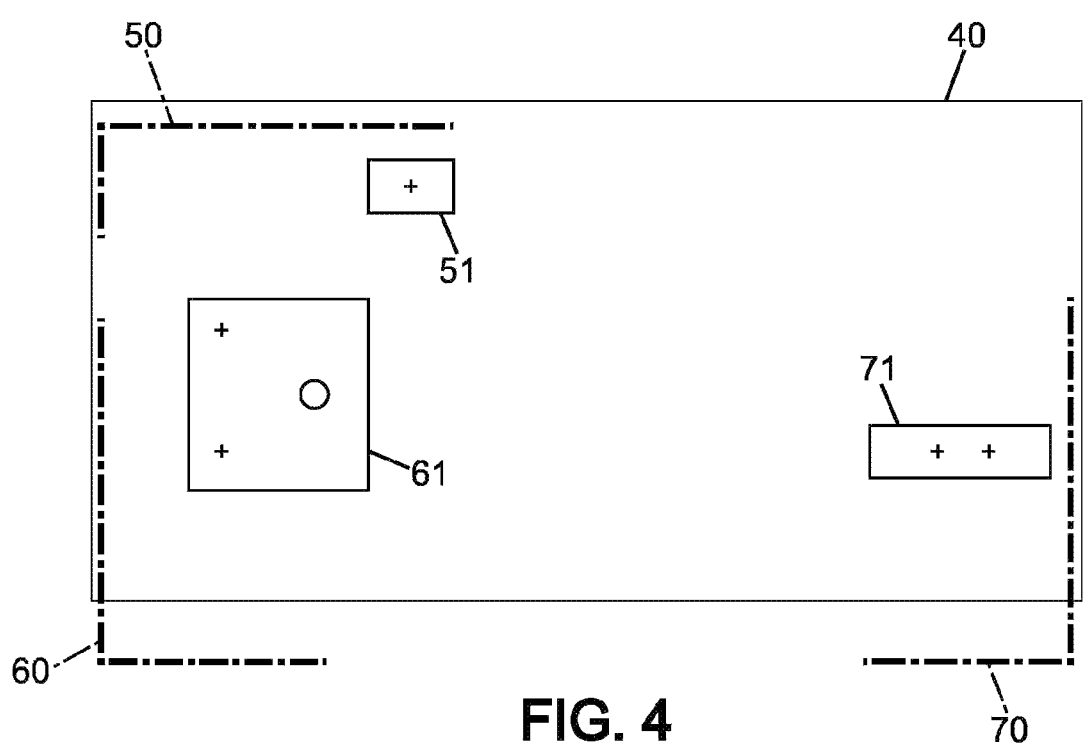
FIG. 4 is a diagram showing the working surface with layout information projected thereon.

For instance, FIG. 3 shows a working surface 30, as modeled in the BIM, with superimposed layout information assuming perfect alignment of the layout information with the working surface, while FIG. 4 shows the actual working surface 40 with the layout information as projected by means of the apparatus 10.

FIG. 3 gives an image of how the data are structured in the BIM. A number of reference features are defined with respect to the working surface, typically with respect to the edges of the surface or to other patterns visible on the surface. For each of the reference features, first graphical information 50, 60, 70, shown in dash-dot lines in FIG. 3, is defined to depict the feature on the working surface.

The data structure of the BIM also defines subsets of construction elements. Each of these subsets has an associated reference feature and is made of one or more construction elements having setting out positions defined with respect to the reference feature. In the illustration of FIG. 3, there are:

a subset 51 of one construction element having a location for installation designated by second graphical information 52. Subset 51 is associated with a reference feature depicted by first graphical information 50 and corresponding to the top left corner of the working surface 30;

a subset 61 of one or more construction elements having three locations for installation designated by second graphical information 62, 63, 64. Subset 61 is associated with a reference feature depicted by first graphical information 60 and corresponding to the bottom left corner of the working surface 30;

a subset 71 of one or more construction elements having two locations for installation designated by second graphical information 72, 73. Subset 71 is associated with a reference feature depicted by first graphical information 70 and corresponding to the bottom right corner of the working surface 30.

Within each subset having more than one location for installation, the locations for installation have a fixed spatial relationship to make sure that the construction element(s) of the subset can be properly installed. This fixed spatial relationship is denoted by a position attribute which indicates the relative position of the subset, along the working surface 30, with respect to the associated reference feature. In the example illustrated in FIG. 3, the position attribute is in the form of x, y coordinates defining a location for installation of a construction element of the subset with respect to the reference feature, as indicated by arrows in the figure. The other locations for installation belonging to the same subset, if any, are then given by fixed offsets with respect to the location pointed to by the position attribute.

It should be noted that there can be more than one construction element subset associated with a given reference feature.

Figure 7:
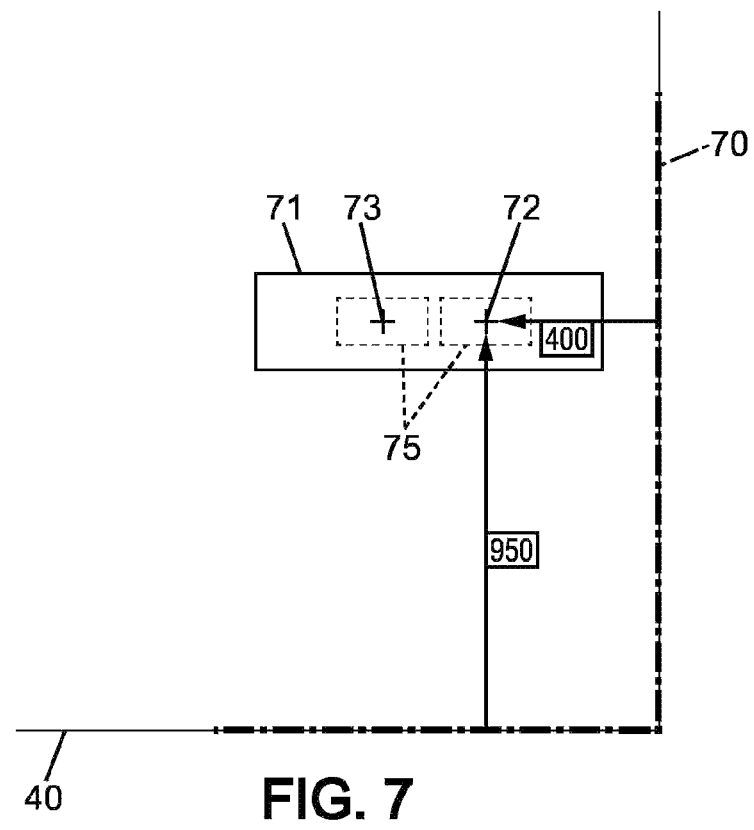
FIG. 7 is a diagram showing ranges displayed to indicate setting out tolerances of some construction elements.

Each of the above-mentioned locations for installation is marked by a specific symbol 52, 62-64, 72-73 such as a dot, cross, line, circle, etc. Each location may correspond to a point for anchoring a construction element, a point for drilling a hole, an end of the line for cutting in the working surface, etc. On the working surface, the first graphical information 50, 60, 70 depicting reference features and the second graphical information 52, 62-64, 72-73 designating locations for installation of construction elements may be supplemented by other graphical information indicating, for example:

an outline or picture of the construction elements to be installed;

links between the locations for installation and the reference features (e.g. displaying the arrows as shown in FIG. 3);

figures indicating coordinates of the locations for installation parallel to the working surface (e.g. lengths of the arrows, such as 400 mm and 950 mm in the example of FIG. 7);

ranges 75 around designated locations 72, 73 for installation of construction elements, as discussed below with reference to FIG. 7;

inter-subset arrangement rules defining acceptable positions of construction element subsets relatively to each other (e g minimum distance of 600 mm shown in FIG. 3).

For easier perception of the projected information by the operator, an option is that the processor 12 controls the projector 11 to display different construction elements or different subsets in connection with their associated reference features with different colors.

When displayed on the actual working surface 40 via the projector 11, the first graphical information 50, 60, 70 may not match the reference features of the working surface 40, as shown in FIG. 4. This can be due to alignment of the BIM information up to a translation vector parallel to the working surface, or to the fact that the working surface 40 which was built does not have the same exact dimensions as the theoretical working surface 30 defined in the BIM, due to construction tolerances.

As can be seen in FIG. 4, merely shifting all the projected first graphical information 50, 60, 70 as a whole may not give rise to proper alignment with all the reference features of the working surface.

The proposed structure of the BIM makes it possible for the operator to deal with such situations efficiently, without the need to call the site engineer in order to make a decision about the precise locations for setting out the construction elements. What is needed for the operator to take all the necessary actions is defined in the BIM data structure directly, owing to the association of subsets with different reference features.

Figure 5:
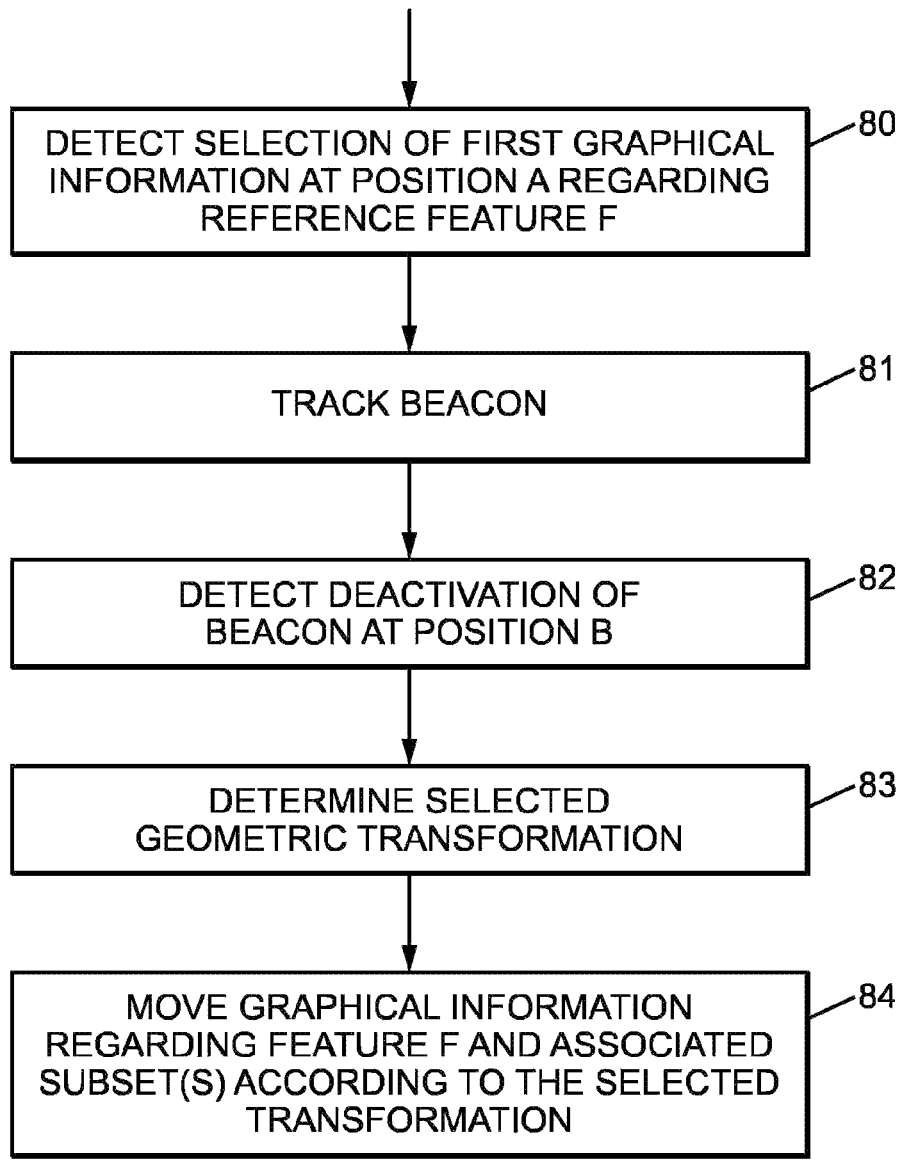
FIG. 5 is flow chart illustrating procedure for calibrating graphical information on a working surface forming part of embodiments of the invention.

The operator's actions can be of the drag-and-drop type by means of the handheld tool 20. The operator selects the first graphical information as projected on the working surface, and drags it to the desired location which is the location of the relevant reference feature. The second graphical information designating the locations for installation of construction element(s) of the subset(s) associated with the reference feature is dragged together with the first graphical information. The procedure, executed under control of the processor 12 as shown in FIG. 5, may be referred to as "calibrating" the graphical information pertaining to a given subset. An illustration is provided in FIG. 6 with respect to the reference feature depicted by the first graphical information 50.

First, activation of the beacon 21 of the handheld tool 20 is detected by the total station 14 and the 3D coordinates (position "A") of the beacon upon activation are transmitted to the processor 12. In step 80, the processor 12 checks whether the 3D coordinates provided by the total station 14 correspond to a location where the first graphical information for one of the reference features, "F", is projected. If so, it is determined that the operator has selected the first graphical information regarding feature F at position A. In step 81, the total station 14 tracks the beacon 21 as it is moved by the operator. When the operator deactivates the tool 20 (step 82) the total station 14 determines the 3D coordinates (position "B") of the beacon upon deactivation, and provides those 3D coordinates to the processor 12.

Based on the coordinates of positions A and B, the processor 12 determines the geometric transformation selected by the operator at step 83. If the transformation is restricted to a translation, it may be determined by projecting vector AB on the working surface to determine a translation vector parallel to the working surface.

Finally, in step 84, the processor 12 re-processes the BIM information concerning reference feature F and its associated construction element subset(s) by taking into account the selected geometric transformation to generate a new control signal for the projector 11 in order to shift together:
the first graphical information selected by the operator; and
for each subset associated with the reference feature F, the second graphical information designating the locations for installation of construction elements.

Figure 6:
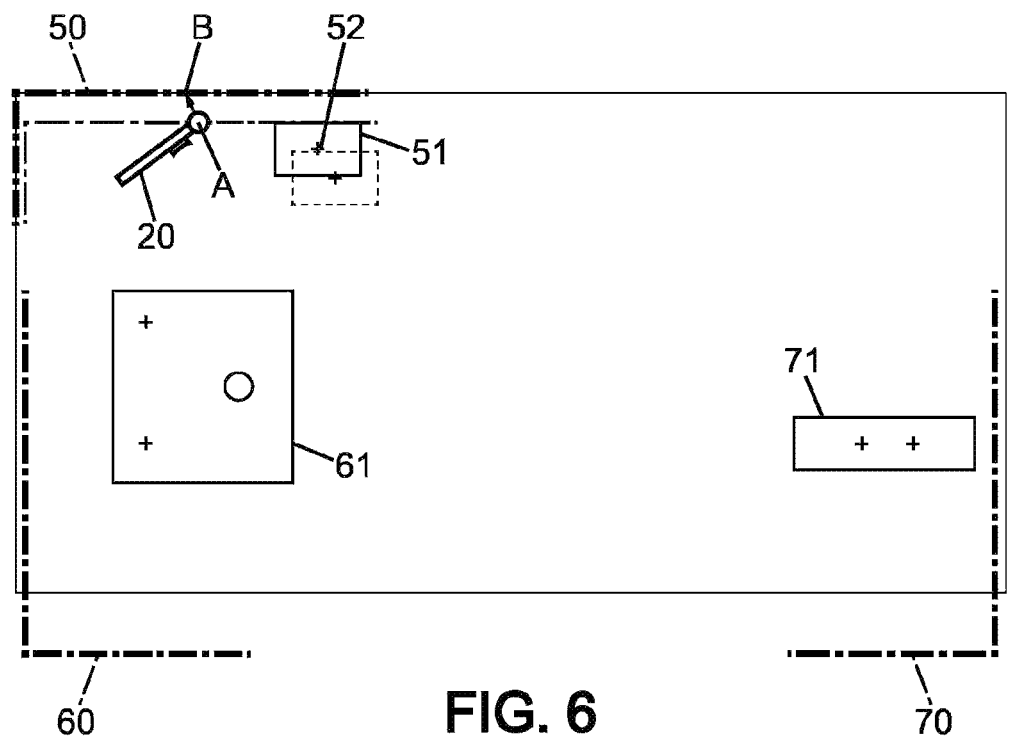
FIG. 6 is a diagram similar to that of FIG. 4 with some of the layout information shifted based on an operator's actions in accordance with the calibration procedure of FIG. 5.

The result projected on the working surface 40 is as shown in FIG. 6. Proper positioning of the location 52 of the subset associated with the reference feature depicted by the first graphical information 50 is obtained. The operator can then perform the required action application 52. The above-described calibration procedure ensures consistency of the locations designated on the actual working surface 40 with the setting out rules defined for each subset in the BIM.

The procedure can be repeated for each reference feature defined in the BIM with respect to the working surface. The procedure is performed independently for each reference feature.

The setting out of the construction elements by means of the operator's usual tools (drill, saw, nail gun, etc.) can be performed on the working surface after all its reference features have been aligned by the calibration procedure. However, it will often be more convenient for the operator to perform the calibration procedure with respect to one reference feature, to set out the construction element(s) of the subset(s) associated with that reference feature, and to continue with the calibration procedure with respect to the next reference feature in another part of the working surface 40.

The BIM may have an original version corresponding to the designers' specifications and an as-built version representing the actual construction which is carried out. If, for example, one of the working surfaces was not built exactly as prescribed in the original version of the BIM, the deviation may be observed by the operator while the layout information is projected. After the calibration procedure performed for one or more construction element subsets relating to such surface, it may be appropriate to update the as-built version of the BIM, either automatically or depending on a specific update signal entered by the operator to take into account the changes performed by the operator. In this case, the change of the projected first and second graphical information is followed by a step in which the processor 12 modifies the as-built version of the BIM to reflect the change.

FIGS. 5-6 illustrate the calibration procedure in a case where the geometric transformations selectable by the user are translations along the working surface. It will be appreciated that, more generally, the geometric transformation may consist to any bijection such as translation, rotation, dilations/contractions along one or two directions, or any combination thereof. It may also involve deformation by any mathematical surface bijection linking the model graphical information described in its Euclidian space to any plan or curved working surface. Parameters for transformations more complex that translations can be determined based on a user's selection performed by means of the available man machine interface. Zoom actions can be selected by particular combinations of activations and movements of the beacon 21. The user may also be invited, by visual cues projected on the surface, to select individual points of the working surface in order to evaluate displacements of those individual points, from which the processor 11 performs interpolations and/or extrapolations to determine the overall geometric transformation. If some elements should not be deformed (according to the BIM data), this can be indicated using specific colors in the displayed information.

The BIM may further include positional tolerance attributes for at least some of the construction elements. Preferably, the positional tolerance attribute is shared for all the construction elements within a same subset. The tolerance attribute may vary from one subset to another, including for subsets associated with a same reference feature.

The tolerance attribute for a subset indicates a range by which the operator is allowed to deviate when installing construction elements of the subset. Based on the tolerance attribute for a subset, the processor 12 controls the projector 11 to indicate, on the working surface, a range around the designated location for installation of the construction elements of the subset.

In the example shown in FIG. 7, the range relating to a tolerance attribute is indicating by a contour 75 surrounding the designated locations 72, 73 for installation of a construction element. By viewing the contour 75, the operator can determine the allowed range for installing the construction elements of the subset. The contour 75 may be displayed around each of the locations 72, 73, or around only one or some of them.

The BIM may further include inter-subset arrangement rules defining acceptable positions of a construction element subset relatively to other subsets.

For example, assume that FIG. 3 represents a wall of a bathroom, subset 61 relates to a shower cubicle and subset 71 relates to a light switch. An arrangement rule, defined by the designer of the building or by mandatory standards, defines that subset 71 (eg. the light switch) must be at a distance of more than 60 mm from subset 61 (e.g. the edge of the cubicle). Such a rule may be expressed, in the BIM data structure, as an attribute of each of the subsets 61, 71, to be checked whenever the operator moves one of the subsets (within the range defined by its individual tolerance attribute).

The processor 12 may process the inter-subset arrangement rules provided in the BIM with respect to a working surface to control the projector 11 so as to display a visual indication of those rules on the working surface 40 in connection with each construction element subset. An illustrative example of such a visual indication is shown in FIG. 3 with lines and display of a minimum distance between the relevant parts of subsets 61 and 71.

Figure 8:
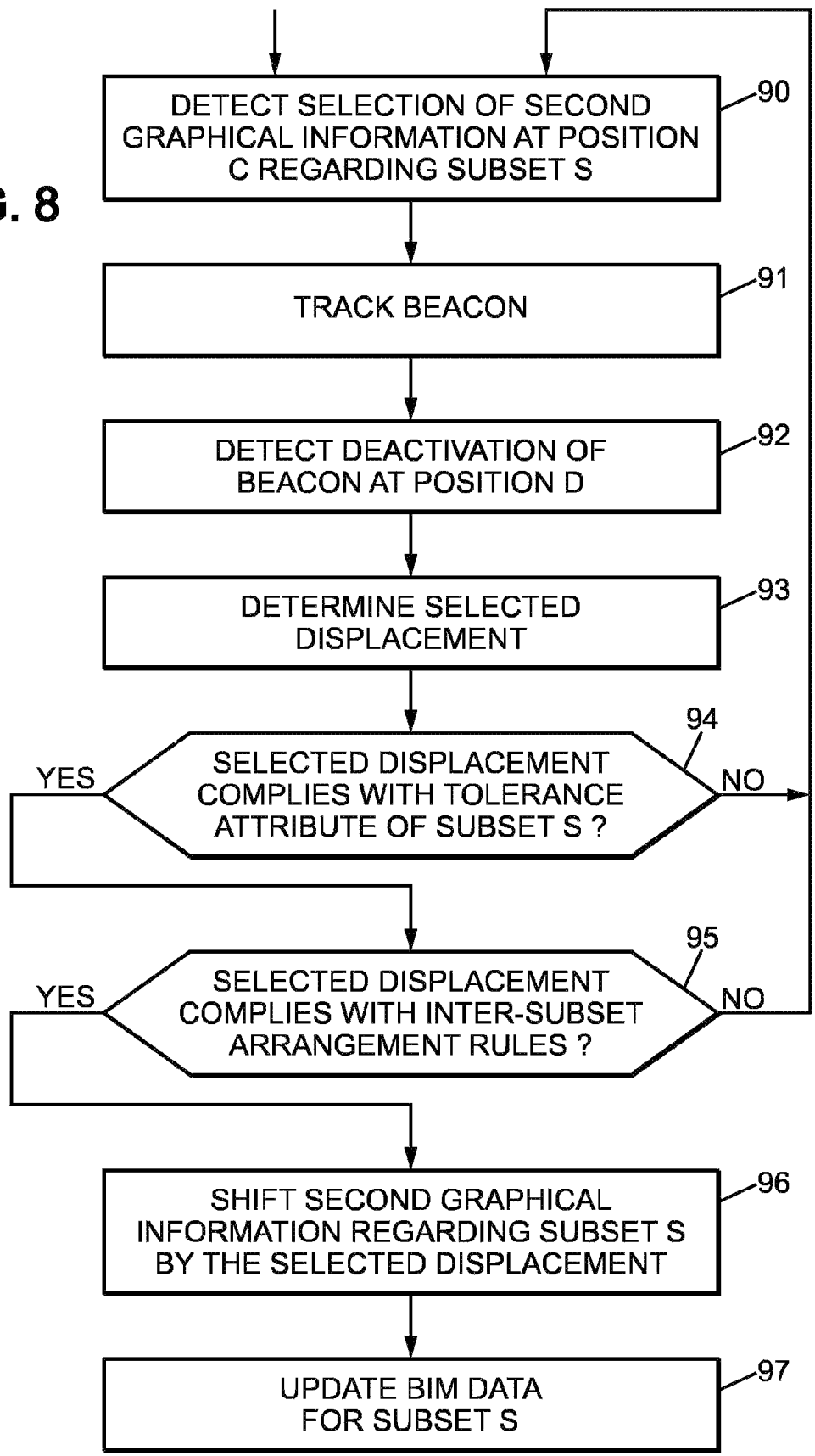
FIG. 8 is flow chart illustrating procedure for repositioning graphical information corresponding to a subset of construction elements.

Another kind of interaction of the processor 12 with the operator is the repositioning procedure illustrated in FIG. 8. That procedure is initiated by the operator's selection of second graphical information regarding a subset S of construction elements. By means of the above-described man machine interface, such selection is detected by the processor at step 90 of FIG. 8, as well as the position "C" where the selection by the operator took place. The subset S is identified based on which second graphical information was selected by the operator. In step 91, the total station 14 tracks the beacon 21 as it is moved by the operator. When the operator deactivates the tool 20 (step 92) the total station 14 determines the 3D coordinates (position "D") of the beacon upon deactivation, and provides those 3D coordinates to the processor 12.

Based on the coordinates of positions C and D, the processor 12 determines the displacement selected by the operator at step 93. Again, if the displacement is restricted to a translation, it may be determined by projecting vector CD on the working surface to determine a translation vector parallel to the working surface.

In the example illustrated by FIG. 8, the next step 94 consists for the processor 12 in checking whether the displacement selected by the operator complies with the tolerance attributes defined in the BIM for the subset S identified in step 90. If the displacement is too large in view of the allowed range, the operator's action is invalidated and the processor 12 returns to a state of waiting for a next action by the operator.

Then, at step 95, the processor 12 checks whether the displacement selected by the operator complies with any inter-subset arrangement rules defined in connection with the subset S identified in step 90. Again, if the selected displacement leads to violating an arrangement rule, the operator's action is invalidated and the processor 12 returns to a state of waiting for a next action by the operator.

If both checks 94, 95 give positive results, the processor 12 re-processes the BIM information concerning subset S at step 96, by taking into account the selected displacement to generate a new control signal for the projector 11 in order to shift the second graphical information designating the locations for installation of the construction element(s) of subset S. This is done without shifting the first graphical information depicting the reference feature F to which the selected subset S is associated.

Figure 9:
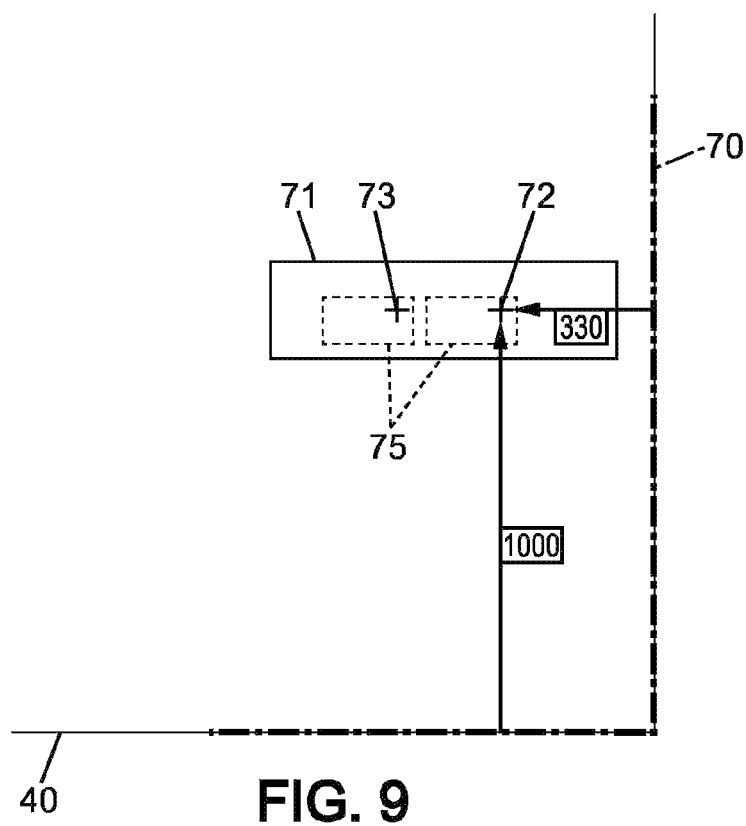
FIG. 9 is a diagram similar to that of FIG. 7 with some of the layout information shifted based on an operator's actions in accordance with the repositioning procedure of FIG. 8.

FIG. 9, to be compared with FIG. 7, illustrates an example where the operator dragged-and-dropped the second graphical information 72 or 73 upwards by 50 mm and to the right by 70 mm. This gives rise to shifting the graphical information 72, 73 designating the locations for installation of construction elements of subset 71, while the first graphical information 70 depicting the reference feature to which the subset is linked remains at a fixed position. Likewise, the displayed ranges 75 indicating the allowed places for setting out the construction elements of subset 71 remain at a fixed position with respect to the first graphical information 70.

Following shifting of the selected second graphical information at step 96, the processor may take into account the operator's decision by updating the BIM data for the subset S, at step 97. This consists in updating the position attribute for the subset S based on the second displacement. In the example of FIGS. 7 and 9, the horizontal and vertical coordinates defined for the subset 71 in the BIM are updated. In that example, the position attribute (horizontal and vertical coordinates) is explicitly displayed on the working surface 40, and therefore the update of the BIM data is directly visible by the operator on the working surface 40.

If, for any reason, the operator decides not to set out the element at the exact position 72, 73 initially defined in the BIM (FIG. 7), while remaining within the allowed range 75, it is important that he/she uses the handheld tool 22 to perform the repositioning procedure according to FIG. 8, so that the BIM information, which may be re-used later on, accurately reflects the actual setting out action.

It will be appreciated that the embodiments described above are illustrative of the invention disclosed herein and that various modifications can be made without departing from the scope as defined in the appended claims.

The invention claimed is:

1. A method of assisting installation of construction elements in a construction work, the method comprising:
    projecting layout information on a working surface of the construction work,
    wherein the projected layout information is obtained from a model of a portion at least of the construction work and includes first graphical information depicting a reference feature visible on the working surface, and second graphical information designating at least one location for installation of a construction element, the location being linked, in the model, to the reference feature depicted by the first graphical information; and
    in response to a user action of selecting the first graphical information and a geometric transformation, changing the projected first and second graphical information together in accordance with the selected transformation,
    wherein the changing of the first graphical information creates an associated change in the second graphical information, and
    wherein the geometric transformation is a translation, a rotation, a dilatation, or a contraction along one or two directions, or any combination thereof.

2. The method as claimed in claim 1, wherein selecting the first graphical information comprises:
   detecting activation of a handheld beacon;
   determining spatial coordinates of the activated beacon; and
   selecting the first graphical information if the determined spatial coordinates match a projection position of the first graphical information.

3. The method as claimed in claim 2, wherein the geometric transformation is selected as a translation along the working surface, and wherein selecting the translation comprises:
   tracking the beacon in an activated state;
   determining spatial coordinates of the beacon being tracked;
   detecting deactivation of the beacon; and
   determining the selected translation based on the spatial coordinates of the beacon upon activation and the spatial coordinates of the beacon upon deactivation.

4. The method as claimed in claim 1, further including a setup phase comprising:
   placing projection equipment in front of the working surface;
   detecting a plurality of activations of a handheld beacon;
   determining spatial coordinates of the beacon upon each detected activation;
   acquiring parameters of a spatial relationship between the projection equipment and the working surface as a function of the determined spatial coordinates; and
   determining data for projecting the layout information on the working surface from the projection equipment based on the model and the acquired parameters of the spatial relationship.

5. The method as claimed in claim 4, wherein the setup phase further comprises projecting symbols on the working surface to prompt a user to successively activate the beacon at locations of the projected symbols.

6. The method as claimed in claim 4, wherein the projection equipment is associated with a positioning system to evaluate position and orientation thereof with respect to the model.

7. The method as claimed in claim 6, wherein the positioning system comprises a rangefinder to provide distance information between the working surface and the projection equipment, wherein said distance information is processed to automatically adjust a scale of the projected layout information.

8. The method as claimed in claim 6, wherein the positioning system comprises a camera, the method further comprising analyzing an output signal of the camera to assist in positioning and scaling of the projected layout information.

9. The method as claimed in claim 1, wherein a plurality of reference features visible on the working surface are defined in the model, wherein the projected layout information includes first graphical information depicting each of the plurality of reference features visible on the working surface, and wherein the first graphical information depicting one of the plurality of reference features is independently changeable in response to a user action of selecting said first graphical information and a respective geometric transformation.

10. The method as claimed in claim 1, wherein the model further includes positional tolerance attributes for at least some of the construction elements.

11. The method as claimed in claim 10, further comprising:
   processing the positional tolerance attribute for a construction element so as to indicate, on the working surface, a range around the designated location for installation of said construction element.

12. The method as claimed in claim 1, wherein the model has a data structure defining construction element subsets respectively associated with a plurality of reference features, and
   wherein for each subset associated with a reference feature, the data structure includes a respective position attribute indicating a relative position of said subset with respect to said reference feature.

13. The method as claimed in claim 12, wherein the data structure of the model further includes inter-subset arrangement rules defining acceptable positions of a construction element subset relatively to other subsets.

14. The method as claimed in claim 13, further comprising:
   projecting a visual indication of inter-subset arrangement rules on the working surface in connection with each construction element subset associated with a reference feature visible on the working surface.

15. The method as claimed in claim 12, further comprising:
   in response to a user action of selecting the second graphical information designating a location for installation of a construction element of a subset on the working surface and a displacement along the working surface, shifting the second graphical information projected on the working surface to designate the locations for installation of the construction elements of said subset in accordance with the selected displacement, independently of the first graphical information depicting the reference feature to which said subset is associated.

16. The method as claimed in claim 15, wherein shifting the second graphical information independently of the first graphical information is performed on condition that the selected displacement is within any positional tolerance attributes defined in the model for construction elements of said subset.

17. The method as claimed in claim 15, wherein shifting the second graphical information independently of the first graphical information is performed on condition that the selected displacement complies with inter-subset arrangement rules provided in the model to define acceptable positions of construction element subsets relatively to other subsets.

18. The method as claimed in claim 15, further comprising, following shifting of the second graphical information independently of the first graphical information:
   updating the position attribute for said construction element subset in the data structure of the model based on the selected displacement.

19. The method as claimed in claim 1, further comprising, following a change of the projected first and second graphical information in response to a user action of selecting the first graphical information and a geometric transformation:
   modifying an as-built version of the model to reflect the change.

20. The method as claimed in claim 1, wherein the model of a portion at least of the construction work is a Building Information Model (BIM).

21. The method as claimed in claim 1, further comprising projecting a scale indication along at least one dimension of the working surface.

22. A system for assisting installation of construction elements in a construction work, the system comprising:
projection equipment for projecting layout information on a working surface of the construction work;
a processor having access to a model of a portion at least of the construction work, for controlling the projection equipment such that the projected layout information includes first graphical information depicting a reference feature visible on the working surface, and second graphical information designating at least one location for installation of a construction element, the location being linked, in the model, to the reference feature depicted by the first graphical information; and
a user interface for detecting a user action of selecting the first graphical information and a geometric transformation,
wherein the processor is configured to control the projection equipment, in response to the detected user action, by changing the projected first and second graphical information together in accordance with the selected transformation,
wherein the changing of the first graphical information creates an associated change in the second graphical information, and
wherein the geometric transformation is a translation, a rotation, a dilatation, or a contraction along one or two directions, or any combination thereof.

23. The system as claimed in claim 22, wherein the user interface comprises a handheld beacon and a total station for determining spatial coordinates of the beacon.

24. The system as claimed in claim 21, wherein the processor is further configured, with the projection equipment and the user interface, to control execution of steps of a method in accordance with claim 2.

25. A non-transitory computer readable medium storing a computer program, wherein the computer program comprises instructions for implementing a method of assisting installation of construction elements in a construction work, the program comprising instructions to be executed in a processor associated with projection equipment, a user interface and an interface with a model of a portion at least of the construction work, wherein execution of the instructions controls:
projecting layout information on a working surface of the construction work,
wherein the projected layout information is obtained from the model and includes first graphical information depicting a reference feature visible on the working surface, and second graphical information designating at least one location for installation of a construction element, the location being linked, in the model, to the reference feature depicted by the first graphical information; and
in response to a user action of selecting the first graphical information and a geometric transformation, changing the projected first and second graphical information together in accordance with the selected geometric transformation,
wherein the changing of the first graphical information creates an associated change in the second graphical information, and
wherein the geometric transformation is a translation, a rotation, a dilatation, or a contraction along one or two directions, or any combination thereof.

26. A method of structuring information in a model of a portion at least of a construction work, the method comprising:
for each of a plurality of reference features visible on at least one working surface of the construction work, storing first data in the model defining a 3D position of said reference feature;
for each of a plurality of construction elements to be installed on the working surface, storing second data in the model describing at least one location for installation of said construction element; and
defining, in the model, construction element subsets respectively associated with the reference features, wherein for each subset associated with a reference feature, the second data include a respective position attribute indicating a relative position of said subset with respect to said reference feature.

27. The method as claimed in claim 26, wherein for at least some of the construction elements, the second data further include a positional tolerance attribute parallel to the working surface.

28. The method as claimed in claim 26, further comprising:
storing in the model representations of inter-subset arrangement rules defining acceptable positions of a construction element subset relatively to other subsets.

29. A method of assisting installation of construction elements in a construction work, the method comprising:
projecting layout information on a working surface of the construction work,
wherein the projected layout information is obtained from a model of a portion at least of the construction work and includes first graphical information depicting a reference feature visible on the working surface, and second graphical information designating at least one location for installation of a construction element, the location being linked, in the model, to the reference feature depicted by the first graphical information; and
in response to a user action of selecting the first graphical information and a geometric transformation, changing the projected first and second graphical information together in accordance with the selected transformation,
wherein the reference feature comprises an edge, a ceiling, or a floor.

30. A system for assisting installation of construction elements in a construction work, the system comprising:
projection equipment for projecting layout information on a working surface of the construction work;
a processor having access to a model of a portion at least of the construction work, for controlling the projection equipment such that the projected layout information includes first graphical information depicting a reference feature visible on the working surface, and second graphical information designating at least one location for installation of a construction element, the location being linked, in the model, to the reference feature depicted by the first graphical information; and
a user interface for detecting a user action of selecting the first graphical information and a geometric transformation,
wherein the processor is configured to control the projection equipment, in response to the detected user action, by changing the projected first and second graphical information together in accordance with the selected transformation, and
wherein the reference feature comprises an edge, a ceiling, or a floor.

31. A non-transitory computer readable medium storing a computer program, wherein the computer program comprises instructions for implementing a method of assisting installation of construction elements in a construction work, the program comprising instructions to be executed in a processor associated with projection equipment, a user interface and an interface with a model of a portion at least of the construction work, wherein execution of the instructions controls:

projecting layout information on a working surface of the construction work, wherein the projected layout information is obtained from the model and includes first graphical information depicting a reference feature visible on the working surface, and second graphical information designating at least one location for installation of a construction element, the location being linked, in the model, to the reference feature depicted by the first graphical information; and in response to a user action of selecting the first graphical information and a geometric transformation, changing the projected first and second graphical information together in accordance with the selected geometric transformation, wherein the reference feature comprises an edge, a ceiling or a floor.

\* \* \* \* \*